United States Patent
Beilin et al.

(12)
(10) Patent No.: US 6,221,567 B1
(45) Date of Patent: Apr. 24, 2001

(54) METHOD OF PATTERNING POLYAMIC ACID LAYERS

(75) Inventors: Solomon I. Beilin, San Carlos; William T. Chou, Cupertino; David Dung Ngo, San Jose, all of CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/226,974

(22) Filed: Jan. 8, 1999

(Under 37 CFR 1.47)

Related U.S. Application Data

(60) Provisional application No. 60/071,417, filed on Jan. 14, 1998.

(51) Int. Cl.$^7$ ........................................... G03F 7/00
(52) U.S. Cl. ............................................. 430/323; 430/317
(58) Field of Search ..................... 430/323, 325, 430/326, 317

(56) References Cited

U.S. PATENT DOCUMENTS

| | | |
|---|---|---|
| 4,353,778 | * 10/1982 | Fineman et al. ............... 156/644 |
| 4,846,929 | 7/1989 | Bard et al. . |
| 5,183,534 | 2/1993 | Fjare et al. . |
| 5,292,445 | 3/1994 | Fjare et al. . |
| 5,342,736 | 8/1994 | Chen et al. . |
| 5,350,487 | 9/1994 | Ameen et al. . |
| 5,374,503 | 12/1994 | Sachdev et al. . |
| 5,591,285 | 1/1997 | Afzali-Ardakani et al. . |

* cited by examiner

Primary Examiner—John A. McPherson
(74) Attorney, Agent, or Firm—Coudert Brothers

(57) ABSTRACT

Methods of etching polyamic acid layers and the like are disclosed. In exemplary embodiments of the present invention, the polymeric acid layer to be etched is alternatively exposed to etchant solutions (etchants) and rinse solutions, where the etchant solutions are of relatively moderate alkalinity and the rinse solutions have a lower pH than the etchant solutions. The present invention enables polymeric acid layers to be developed with standard basic etchants at relatively moderate concentrations and at room temperature with little, if any, corrosion to any underlying metal layers. The present invention enables the more reliable and cleaner spin-spray processing method to be employed, thereby significantly increasing yields and reducing overall processing costs. The present invention also enables the etching of thick layers of polymeric acid without the need for special treatments, such as exposure to highly concentrated etchant solutions or high temperature processing conditions.

34 Claims, 2 Drawing Sheets

METHOD OF PATTERNING POLYAMIC ACID LAYERS

CROSS-REFERENCE TO RELATED APPLICATIONS

This application claims the benefit of U.S. Provisional Application No. 60/071,417 filed Jan. 14, 1998.

FIELD OF THE INVENTION

The present invention relates to patterning polymer layers with photolithographic and wet-etching processes.

BACKGROUND OF THE INVENTION

Polyimide layers are frequently used in the construction of micro-electronic devices and chip packaging structures. A polyimide layer may be formed on a substrate by coating the substrate with a precursor material, generically called polyamic acid, and then curing the precursor material with a heat treatment, which converts the polyamic acid into polyimide and water. The layer of precursor polyamic material may be patterned before or after the heat treatment step.

Polyamic acids generally comprise chains-of repeated organic units. Each organic unit generally has a number of benzene rings ($C_6H_6$) linked together in a serial manner by intermediate molecules, such as singlet oxygen (—O—) and carbon-nitrogen pairs (—C—N—). In the carbon-nitrogen pairs, an oxygen atom may be double bonded to the carbon atom, and a hydrogen atom may be single bonded to the nitrogen atom. The chemical formula for one repeated unit of a basic and exemplary polyamic acid is provided below:

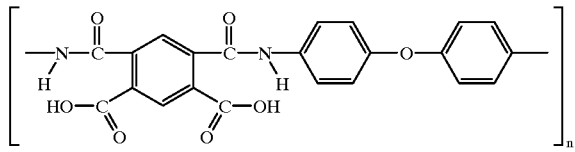

This basic structure of polyamic acid may be modified by adding additional atoms or substituting some atoms with different atoms. One common feature of polyamic acids is the location of a carboxyl group (COOH) and a carbon-nitrogen group (—C—N—) in close proximity to one another, often on adjacent positions of a carbon ring as shown above.

Carboxyl groups (COOH), which are commonly found in organic acids, enable the hydrogen atom in the group to be disassociated in water to provide acidic action. Typically, in a polyamic acid, there are two carboxyl groups bonded to two respective carbon atoms of a benzene ring in each repeated unit. The carbon atom in the carboxyl group has a single bond to the respective carbon atom in the benzene ring, a double bond to one of the oxygen atoms, and a single bond to an oxygen atom of an OH group. The polyamic acid, by itself, is a solid which is not readily dissolvable in acidic aqueous solutions. However, in basic solutions, the acid groups react with the alkaline reagents of such solutions, which enables the polymeric acid to more readily dissolve.

When sufficient energy is imparted to the polyamic acid, such as by the application of heat to a temperature above 200° C., the OH group of a carboxyl group (COOH) can react with the hydrogen atom of an adjacent carbon-nitrogen pair (—C—N—) to form a water molecule ($H_2O$). In this process, the carbon atom in the decomposed carboxyl group forms a single bond with the nitrogen atom from the carbon-nitrogen pair. The resulting molecular unit is called a polyimide unit and has the following form:

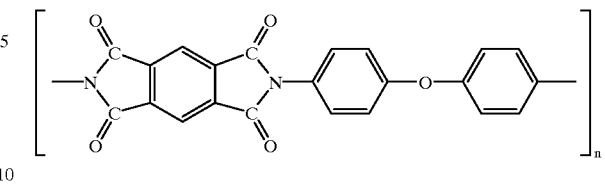

The formation of the single bond between the carbon and nitrogen atoms forms a cyclic ring having a nitrogen atom and a number of carbon atoms, which is known as an imide ring:

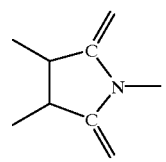

Accordingly, the above reaction process is often called "imidization", or "imide-ring cyclization," and is well known in the art. The imidization reaction destroys the acidic action of the carboxyl group, which greatly reduces the solubility of the polyamic acid.

Of course, the carboxyl group (COOH) and the carbon-nitrogen pair (—C—N—) which react together may not be attached to a common benzene ring, but may be attached to separate benzene rings on different polymer chains in close proximity to one another. In this case, a cyclic ring is not formed, but two polyamic acid chains are cross-linked together. Nonetheless, the acidic action of the carboxyl group is destroyed, and the solubility of the polyamic acid is reduced. Because the results are the same as in the previous case, the reaction is often referred to as "imidization" as well. The reactions for carboxyl group decomposition and imidization are commonly initiated by exposing the polyamic acid to temperatures in the range between 300° C. and 450° C. Once the polyamic acid becomes imidized to a substantial degree (usually more than 50% of carboxyl groups being decomposed and re-bonded to carbon-nitrogen pairs), it is referred to as polyimide. As explained in greater detail below, the present invention is related to the etching of polyamic acid, not to the etching of polyimide.

There are many modified forms of polyamic acid currently available which have made various modifications to the repeating organic units in the polymer chains. Nonetheless, all the forms of polyamic acid have carboxyl groups (COOH), or other acidic functional groups, which are capable of decomposing and forming cyclic rings (e.g., imide rings) with respective nearby intermediate molecules of their respective polymer chains, and/or capable of decomposing and forming chemical bonds to the intermediate molecules of other polymer chains (e.g., cross-links to other polymer chains). For the purposes of the present invention, a polyamic acid is defined as a composition having a plurality of polymer chains with different molecular weights (MW) and MW distributions, with each chain having a plurality of acidic function groups (e.g., carboxyl groups), and with at least ten percent of the acidic functional groups on each chain being located near an atom to which it can chemically bond upon decomposition or chemical reaction of the acidic group.

Polyamic acid is often patterned before it is imidized. After a layer of polyamic acid is coated over the substrate, a photoresist layer is often formed over the polyamic acid layer and patterned, which opens up mask apertures over the layer of polyamic acid. The exposed portions of polyamic acid are then wet etched by a suitable basic etchant, which may, for example, comprise tetra-methyl-ammonium hydroxide (TMAH). When using alkaline etchants (e.g., alkaline developers) at moderate concentrations and at room temperature, the inventors have discovered that the exposed portions of polyamic acid can form gelatinous masses (which we call "gels"), particularly for layers thicker than 10 $\mu$m or via apertures having high aspect-ratio dimensions, which impair and/or prevent the complete removal of the exposed portions. Under such conditions, via structures formed in the polyamic acid layer sometimes have their bottoms filled with gelatinous masses, particularly if the via apertures have high aspect ratio dimensions or if the polymeric layer is thick.

Conventional thinking in the art holds that if an alkaline etchant or developer cannot effectively remove material from the exposed portions of the material layer, then one must increase the concentration of the etchant and, if necessary, also increase the temperature of the etchant solution, in order to increase the efficacy of the etchant. Unfortunately, the approaches of increasing the concentration and of increasing the temperature add to the cost of processing the substrates. Moreover, each of the approaches are more easily carried out by bath processing rather than spray processing, the former of which is more difficult to control and has greater particle contamination problems. Moreover, highly concentrated etchant solutions are corrosive to many metal materials used in the construction of microelectronic devices and chip packaging structures; thus, the etching of the polymeric layer often corrodes metal layers underlying the polyamic acid layer.

Accordingly, having thus recognized the problem of gels forming in via apertures which are formed in thick layers or with high-aspect ratio dimensions, the inventors see that there is a need in the art to find less-expensive and less-corrosive ways of etching polyamic acid layers and other similar polymeric layers which comprise acidic functional groups, such as carboxyl groups (COOH).

SUMMARY OF THE INVENTION

The inventors have discovered that alkaline etchants (such alkaline developers) of moderate concentration may be used at room temperature to pattern etch a layer polymeric acid, such as polyamic acid, if the layer is alternately exposed to the etchant and a rinse solution having a lower pH than the etchant. For example, the layer of may first be exposed to the etchant for 60 seconds, then to a substantially neutral water solution for 60 seconds, then to the etchant again for 60 seconds, then to substantially neutral water again for 60 seconds, and so on until all of the polymeric-acid material is removed from the exposed areas. For an unknown reason, via structures are not clogged with gelatinous masses with the interspersion of the lower pH aqueous solution. It may be that the interspersion of the lower pH aqueous solution prevents or limits the formation of gelatinous masses, and/or may be effective in removing the gelatinous masses when they are formed.

Because ordinary alkaline etchants and developers having moderate concentrations may be used at room temperature according to the present invention, the more reliable and cleaner spray processing approach may be used.

The present invention is contrary to the conventional thinking in the art, and is therefore taught against by the conventional thinking. As indicated above, if an alkaline developer or etchant is found to not adequately remove the exposed portions of the material layer, the conventional thinking is that the concentration of the developer or etchant must be increased, which would thereby increase the pH of the developer or etchant. In the present invention, the concentrations of the developers/etchants need only be at their regular (normal) levels, and the exposures of the polymeric layers to the developers/etchants are being interspersed by exposures to rinse solutions which have significantly lower pH levels, rather than higher pH levels.

While the development of the present invention has been particularly motivated by the desire to remove the gel formations encountered with etching of polyamic acid, it may be appreciated that the teachings of the present invention may be applied to other polymeric acid materials which employ other acidic functional groups in addition to, and/or as replacements to, carboxyl groups (COOH).

Accordingly, an advantageous effect of the present invention is to enable polymeric acid layers to be developed with standard basic etchants at relatively moderate concentrations and at room temperature with little, if any, corrosion to the underlying metal layers. Another advantageous effect of the present invention is to enable the more reliable and cleaner spray processing method to be employed, thereby significantly increasing yields and reducing overall processing costs. Yet another advantageous effect of the present invention is to enable the etching of thick layers of polymeric acid without special treatments.

Accordingly, it is an object of the present invention to enable the etching of polymeric-acid layers with standard basic etching solutions, such as NaOH and KOH, rather than just with specialized high strength etching solutions, such as TMAH, which are corrosive to many metals in high concentration.

It is another object of the present invention to enable the etching of polymeric-acid layers with basic etching solutions at relatively moderate concentrations, thereby lowering processing costs and pollution levels.

It is another object of the present invention to enable the etching of polymeric-acid layers with the more reliable and cleaner spray processing approach, thereby increasing manufacturing throughput and lowering overall processing costs.

It is another object of the present invention to enable the etching of polymeric-acid layers without corroding underlying metal layers.

It is another object of the present invention to enable the etching of thick polymeric-acid layers without special treatment steps.

These and other objects of the present invention will become apparent to those skilled in the art from the following detailed description of the invention, the accompanying drawings, and the appended claims.

DETAILED DESCRIPTION OF THE PRESENT INVENTION

Figure 1:
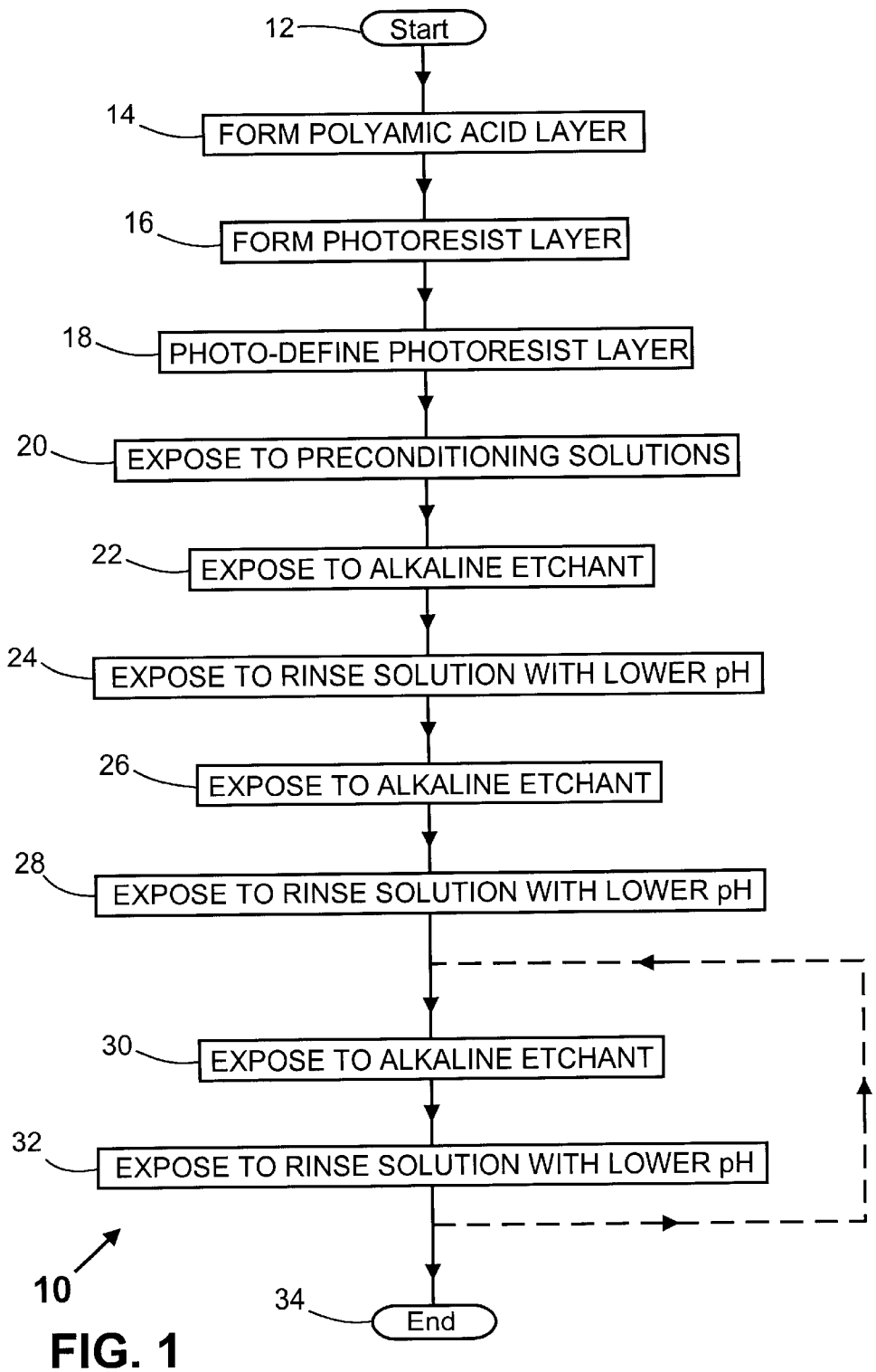
FIG. 1 shows a general flow diagram of the exemplary methods according to the present invention.
Figure 2:
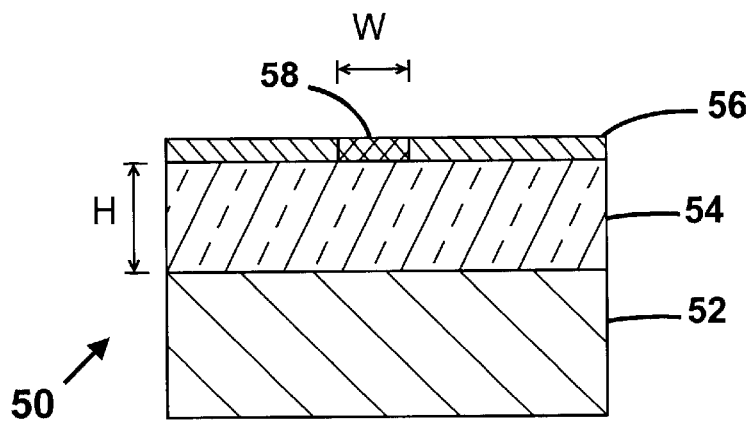
FIG. 2 shows a structure processed according to the present invention after exposure to actinic radiation.

FIG. 1 shows a general flow diagram 10 of the exemplary methods according to the present invention. The flow diagram starts at a block 12, ends at block 34, and a has a plurality of blocks 14–32 in between, each block representing a general processing step. As the first step at block 14, a layer of polyamic acid is formed over a substrate, which may comprise silicon, ceramic, or other substrate materials. Furthermore, there may be other material layers previously formed on the substrate, depending upon the particular application in which the present invention is used. Such additional metal layers may comprise metal pads, or dielectric layers, or combinations thereof. Next, as shown in block 16, a photoresist layer is formed over the polyamic acid layer. The photoresist layer will be used to define an etching window through which the polyamic acid layer will be etched, and thereby serves as an etching mask disposed over the polyamic acid layer. As a next step, the photoresist layer is exposed to actinic radiation (e.g., ultraviolet light) to form latent windows in the photoresist layer, which may be removed by exposure to an alkaline developer solution, as is well known in the art. The resulting structure 50 is shown in FIG. 2 after the completion of the steps. The substrate is shown at 52, the polyamic acid layer is shown at 54, the patterned photoresist layer is shown at 56, and the latent window in the photoresist layer is shown at 58. As is well known in the art, an adhesion layer may be formed over substrate 52 before polyamic acid layer 54 is formed. Also, as is well known in the art, each of layers 54 and 56 may be soft baked at a temperature below 110° C. for a short period of time to drive off solvents, as is well known in the art.

Referring back to FIG. 1, the photoresist layer is then exposed to preconditioning rinse solutions, as shown at block 20, in preparation for the etching steps. The preconditioning rinse solutions may comprise a first solution of de-ionized water having a neutral pH (pH=7), and a second preconditioning solution which comprises a mixture of de-ionized water and an alkaline developer. The layers may be exposed to the preconditioning solutions by dipping the layers in bathes of the solutions for approximately 5 seconds each, or by spraying the solutions onto the layers for approximately 5 seconds while the layers are spun at moderate speeds (e.g., 300 to 700 revolutions-per-minute). A 50% water and 50% developer solution is typically employed for the second preconditioning rinse solution.

Next, the photoresist layer and the polyamic acid layer are exposed to an alkaline etchant, as shown in block 22 for a period of time, followed by exposure to a rinse solution having a lower pH than the alkaline etchant, as shown in block 24, for another period of time. These exposure steps are then repeated again, as shown in blocks 26 and 28, respectively. Typically, the exposure time in block 26 is equal to or less than the exposure time in block 22, and the exposure time in block 28 is the same as or greater than the exposure time in block 24. An exemplary exposure time for blocks 22, 24, and 28 is approximately 1 minute using AZ Developer (manufactured by the Hoechst Corporation) for the alkaline etchant and a neutral de-ionized water for the rinse solution. A typical exposure time for block 26, which is the second exposure to alkaline etchant, may typically be around 40 seconds. The first exposure at block 22 is usually sufficient to develop the latent windows in the photoresist layer and to partially etch the polyamic acid layer beneath the latent windows. The second exposure to the alkaline etchant at block 26 continues the etching of the polyamic acid layer, but typically is not sufficient to etch completely through the polyamic acid layer. A small amount of etching does occur during the rinse exposures since portions of the etching agent adhere to the exposed portions of the polyamic acid layer before they are diluted and removed by the rinse solution.

Figure 3:
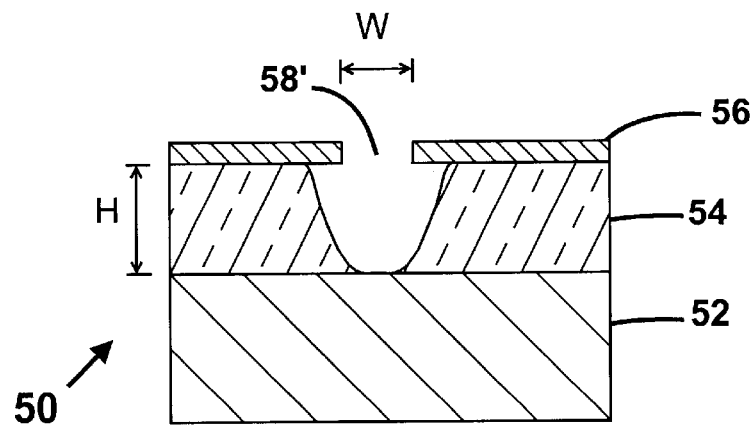
FIG. 3 shows the etched layers resulting from the process of the present invention.
Figure 4:
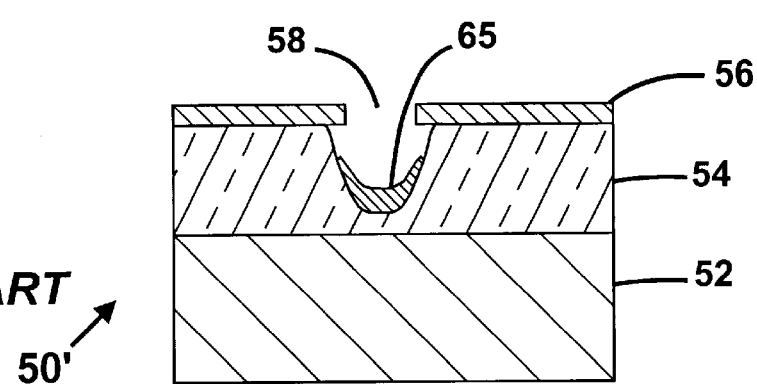
FIG. 4 shows the result of using a conventional etching process according to the prior art.

The exposures to the etchant and rinse solutions are repeated again at least one more time, as shown at blocks 30 and 32. The exposure time to the alkaline etchant in block 30 is typically equal to or less than the time in block 26, and the exposure time to the rinse solution in block 32 is equal to or greater than the exposure time in block 28. The exposure time to the etchant solution is preferably less than 2 minutes (120 seconds), and more preferably less than or equal to approximately 1 minute (60 seconds). The wafers and substrate are then dried by conventional means at the end of processing at block 34. The rinse solution in block 32 is preferably de-ionized water so as to leave no residue during the drying step. The steps of blocks 30 and 32 may be repeated any number of times (as may be required by the thickness of the polymeric layer and/or the strength of the etchant solution), as indicated by the dashed line between blocks 32 and 30. The resulting etched layers are shown in FIG. 3, where the developed latent window in photoresist layer 56 is shown at 58'. The aperture reaches from the top of photoresist layer 56 to the top of substrate 52, without any gel formations in the aperture. FIG. 4 shows the result of using a conventional etched step which does not have interspersed rinse exposures. It is observed that the etching does not occur completely through the polyamic acid layer 54, and that there is a gelatinous mass of material shown at 65. The precise composition of the gelatinous material is not known, but likely comprises hydrolyzed residues of polyamic chains. The residue is particularly noticed in the etching of thick polymeric acid layers (typically around greater than or equal to 10 $\mu$m), and in the etching of via apertures having high aspect-ratio dimensions (aspect ratio greater than approximately 2). The aspect ratio is defined herein as being the thickness of the polymeric layer, which is designated as "H" in FIGS. 2 and 3, divided by the minimum width of the latent window in the photoresist layer (the etch mask), which is designated as "W" in the figures (aspect ratio=H/W).

In preferred embodiments of the present invention, the etchant and rinse solutions are sprayed onto the photoresist and polyamic acid layers while these layers are rotated on a conventional spin-spray development station. Such stations are well known to the art and are conventionally used to develop photoresist layers which have been exposed to patterns of actinic radiation. The polymeric layer is preferably rotated continuously during the spraying steps of blocks 22–32 at a rate of at least 10 rpm (revolutions-per-minute), preferably at a rate of at least approximately 30 rpm, and more typically at a rate of around 50 rpm. Each solution is preferably sprayed for at least 20 seconds at a time, and typically not more than 120 seconds at a time and preferably not more than 60 seconds at a time.

The pH of the etchant solution is preferably between 9 and 13, and more preferably between 11 and 12.5. The pH of the rinse solution is at least 2 pH units below the pH of the etchant solution. Typically, the pH of the rinse solution is not more than 10, and preferably ranges between 6 and 8, with a value of around 7 being typical. The exposure steps to the etchant solution are carried out under low temperature conditions (below 40° C.), and may be readily carried out at room temperature.

Throughout the forgoing steps, care is taken to prevent the acidic functional groups of the polymeric acid layer from being decomposed and imidized, which would thereby cause the layer to become a polyimide layer. Once the layer is imidized with more than 50% of the acid functional groups (i.e., carboxyl groups) being decomposed, much stronger alkaline solutions (having a pH of at least 14) and etch times are required to etch the polyimide material. This substantially raises the chances of corrosion to any underlying metal layers, and substantially raises the costs of processing. Decomposition and imidization can be caused by any of the following (either alone or in combination): heat, microwave radiation, high-energy radiation (electron beam, X-ray, excessive deep UV exposure, etc.), and exposure to strong acids. Accordingly, care should be taken to prevent more than about 50% of the acidic functional groups from being decomposed by limiting or prevent exposure of the polymeric acid layer to the above activation sources.

The following examples are provided to further illustrate the present invention.

EXAMPLE 1
(10 μm thick polyamic acid layer)

1. A silicon wafer, which has a top oxide layer, is coated with the polyimide adhesion promoter VM651 by DUPONT.

2. A 10 μm layer of DUPONT polyamic acid PI2611 is coated over the adhesion promoter.

3. The layers are softbaked at 110° C. for 2 minutes to drive off the fluidizing solvents of the polyamic acid layer; this amount of temperature and time is insufficient to decompose carboxyl groups to any measurable degree.

4. An 8 μm layer AZ4620 positive photoresist (Hoechst Co.) is coated over the polyimide layer to serve as a mask.

5. The layers are softbaked at 95° C. for 2 minutes to drive off the fluidizing solvents of the photoresist layer.

6. The photoresist is then pattern exposed to ultraviolet light (i.e., actinic radiation for 20 seconds at 42 mW/cm$^2$ (as measured at a wavelength of 356 nm) through a pattern mask. The mask comprised apertures having diameters ranging from d=20 μm to d=200 μm in 20 μm steps (i. e., 20 μm, 40 μm, 60 μm, ..., 180 μm, 200 μm), each aperture having a separation pitch with each adjacent aperture of at least four times its diameter (4d).

7. The layers spray developed/etched with the sequence of rinse and etchant solutions shown below in TABLE I, where all water has substantially neutral pH, and spraying rates are those commonly used and found on spray development stations:

[Go to the next page . . .]

TABLE I

|     | Time | Spin Speed | Solution |
| --- | --- | --- | --- |
| (a) | 5 seconds | 600 rpm | water |
| (b) | 5 seconds | 600 rpm | water and AZ Developer (equal amounts) |
| (c) | 60 seconds | 50 rpm | AZ Developer (as etchant) |
| (d) | 60 seconds | 50 rpm | water |
| (e) | 40 seconds | 50 rpm | AZ Developer (as etchant) |
| (f) | 60 seconds | 50 rpm | water |
| (g) | 30 seconds | 50 rpm | AZ Developer (as etchant) |
| (h) | 90 seconds | 50 rpm | water |
| (i) | 40 seconds | 1,600 rpm | spin dry |

8. The photoresist layer is removed (stripped) with n-butyl acetate for 110 seconds, then spin dried at 1,600 rpm for 50 seconds. (These steps may be done on the spray developing station.)

9. The polyamic acid layer is then cured at 350° C. for 30 minutes to convert polyamic acid to polyimide by decomposition of the carboxyl groups and imidization of the decomposed parts with intermediate molecules in the chains. Optical inspection of the resulting via structures in the cured polyamic acid (polyimide) layer showed no detectable residues of polyimide at the bottom of the vias or the sidewalls. Vias with diameters as small as 20 μm were inspected.

Example 2
(20 μm thick polyamic acid layer)

The steps 1–9 of Example 1 were followed except that steps 2 and 3 were repeated (in order, and before starting step 4) to obtain a double coat of polyamic acid for a total thickness of 20 μm, and except that step 7 was modified (as step 7.2) to have longer spray times (at steps e* and g*) as follows:

7.2. Spray develop with the following sequence of rinse and etchant solutions shown in TABLE II, where all water has substantially neutral pH, and spraying rates are those commonly used and found on spray development stations:

TABLE II

|     | Time | Spin Speed | Solution |
| --- | --- | --- | --- |
| (a) | 5 seconds | 600 rpm | water |
| (b) | 5 seconds | 600 rpm | water and AZ (equal amounts) |
| (c) | 60 seconds | 50 rpm | AZ Developer (as etchant) |
| (d) | 60 seconds | 50 rpm | water |
| (e*) | 60 seconds | 50 rpm | AZ Developer (as etchant) |
| (f) | 60 seconds | 50 rpm | water |
| (g*) | 60 seconds | 50 rpm | AZ Developer (as etchant) |
| (h) | 90 seconds | 50 rpm | water |
| (i) | 40 seconds | 1,600 rpm | spin dry |

Optical inspection of the resulting via structures in the cured polyamic acid (polyimide) layer showed the same good results obtained in Example 1: no detectable residues of polyimide at the bottom of the vias or the sidewalls. Vias with diameters as small as 20 μm were inspected.

Comparative Example A

The steps of Example 1 were followed except that there were no interspersions (or interjections) of water sprays between the AZ Developer (etchant) sprays. Steps 1–6 and 8–9 were followed in Example 1, and step 7 was conducted as follows:

7. A Spray develop with the following sequence of rinse and etchant solutions, where all water has substantially neutral pH, where the spraying rates are those commonly used and found on spin-spray development stations, and where the spraying occurs at room temperature (25° C.):

TABLE III

|     | Time | Spin Speed | Solution |
| --- | --- | --- | --- |
| (a) | 5 seconds | 600 rpm | water |
| (b) | 5 seconds | 600 rpm | water and AZ Developer (equal amounts) |
| (c) | 130 seconds | 50 rpm | AZ Developer (as etchant) |
| (d) | 90 seconds | 50 rpm | water |
| (e) | 40 seconds | 1,600 rpm | spin dry |

Optical inspection of the resulting via structures in the cured polyamic acid (polyimide) layer showed significant amounts of polyimide residues at the bottom of the vias and on the via sidewalls.

While the present invention has been particularly described with respect to the illustrated embodiments, it will be appreciated that various alterations, modifications and adaptations may be made based on the present disclosure, and are intended to be within the scope of the present invention. For example, while the examples of the present invention have used the same etchant solution for each exposure to the etchant solution, it may be appreciated that the actual chemical composition of the etching solution may vary or change with each subsequent exposure. For example, the concentration of the etching agent in the solution may vary with each exposure, or the chemistry of the agent may change (e.g., KOH, then NaOH, then KOH). While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of etching a polymeric acid layer having polymer chains having acidic functional groups, said method comprising the steps of:
   (a) disposing an etch mask over the polymeric acid layer;
   (b) exposing the polymeric acid layer to etchant solutions and to rinse solutions in an alternating manner such that the polymeric acid layer undergoes at least two etchant exposures and at least two rinse exposures without being dried from the time of a first etchant exposure through to the time of a second etchant exposure; and
   (c) wherein each rinse solution has a lower pH than the previously applied etchant solution.

2. The method of claim 1 wherein step (b) is performed at a temperature below 40°0 C.

3. The method of claim 1 wherein each etchant solution has a pH which is less than or equal to approximately 12.5.

4. The method of claim 1 wherein each etchant solution has a pH between approximately 11.0 and approximately 12.5.

5. The method of claim 1 wherein each rinse solution has a pH which is at least 2 pH units below the pH value of the previously applied etchant solution.

6. The method of claim 1 wherein each rinse solution has a pH value which is not more than approximately 8.

7. The method of claim 1 wherein said step (b) exposes the polymeric acid layer at least three separate times to at least one etchant solution.

8. The method of claim 1 further comprising the step of rotating the polymeric acid layer at a rate of at least 30 revolutions-per-minute (rpm), and wherein at least one exposure to rinse solution comprises the step of spraying a rinse solution onto the polymeric acid layer, and wherein at least one exposure to etchant solution comprises the step of spraying an etchant onto the polymeric acid layer.

9. The method of claim 1 wherein step (a) comprises the steps of forming a layer of photoresist over said layer of polyamic acid, exposing said photoresist layer to patterned actinic radiation, and exposing the patterned photoresist layer to a pre-conditioning solution which comprises a combination of rinse and etchant solutions.

10. The method of claim 1 wherein said polymeric acid layer comprises polyamic acid.

11. The method of claim 1 wherein substantially the same chemical composition of etchant solution is used in the first and second etchant exposures, and wherein the time period of the second etchant exposure is shorter than the time period of the first etchant exposure.

12. The method of claim 1 wherein substantially the same chemical composition of rinse solution is used in the first and second rinse exposures, and wherein the time period of the second rinse exposure is longer than the time period of the first rinse exposure.

13. The method of claim 1 wherein the time periods of the first and second etchant exposures are each less than 2 minutes.

14. The method of claim 1 wherein the mask has a minimum width dimension W, wherein the polymeric acid layer has a thickness H, and wherein the ratio of H over W is at least 2.

15. The method of claim 1 wherein the thickness of the polymeric acid layer is at least 10 $\mu$m.

16. A method of etching a polymeric acid layer having polymer chains with carboxyl groups, said method comprising the steps of:
   (a) disposing an etch mask over the polymeric acid layer;
   (b) exposing the polymeric acid layer to etchant solutions and rinse solutions in an alternating manner such that the polymeric acid layer undergoes at least two etchant exposures and at least two rinse exposures, said same etch mask being disposed over the polymeric acid layer during at least two etchant exposures and the rinse exposures therebetween, each said rinse solution having a pH of less that approximately 8.0 and each said etchant solution having a pH of at least approximately 10.0; and
   (c) preventing the decomposition of more than 50% of the carboxyl groups of said polymeric acid layer from being decomposed prior to performing step (b).

17. The method of claim 16 wherein step (b) is performed at a temperature below 40° C.

18. The method of claim 16 wherein each said etchant solution has a pH which is less than or equal to approximately 12.5.

19. The method of claim 16 wherein each said etchant solution has a pH between approximately 11.0 and approximately 12.5.

20. The method of claim 16 wherein said step (b) exposes the polymeric acid layer at least three separate times to at least one etchant solution.

21. The method of claim 16 further comprising the step of rotating the polymeric acid layer at a rate of at least 30 revolutions-per-minute (rpm), and wherein at least one exposure to rinse solution comprises the step of spraying a rinse solution onto the polymeric acid layer, and wherein at least one exposure to etchant solution comprises the step of spraying an etchant onto the polymeric acid layer.

22. The method of claim 16 wherein said polymeric acid layer comprises polyamic acid.

23. The method of claim 16 wherein substantially the same chemical composition of etchant solution is used in the first and second etchant exposures, and wherein the time period of the second etchant exposure is shorter than the time period of the first etchant exposure.

24. The method of claim 16 wherein substantially the same chemical composition of rinse solution is used in the first and second rinse exposures, and wherein the time period of the second rinse exposure is longer than the time period of the first rinse exposure.

25. The method of claim 16 wherein the time periods of the first and second exposures to etchant solutions are each less than 2 minutes.

26. A method of selectively etching portions of a polymeric acid layer having polymer chains with acidic functional groups, said method comprising the steps of:
   (a) exposing the polymeric acid layer to etchant solutions and to rinse solutions in an alternating manner such that the polymeric acid layer undergoes at least two etchant exposures and at least two rinse exposures, said solutions being sprayed onto the polymeric acid layer; and
   (b) continuously rotating the polymeric acid layer at a rate of at least 10 rpm during at least two etchant exposures and the rinse exposures therebetween without interruption from the time of a first etchant exposure through to the time of a second etchant exposure.

27. The method of claim 26 further comprising the step of rotating the polymeric acid layer at a rate of at least 30 rpm during each of the exposures to an etchant solution and during each of the exposures to a rinse solution.

28. The method of claim 27 where each etchant solution and each rinse solution is sprayed for at least 20 seconds at a time, but not for more than 120 seconds at a time.

29. The method of claim 26 wherein step (a) is performed at a temperature below 40° C.

30. The method of claim 26 wherein each said etchant solution has a pH which is less than or equal to approximately 12.5.

31. The method of claim 26 wherein said step (b) exposes the polymeric acid layer at least three separate times to the etchant solution.

32. The method of claim 26 further comprising the step of rotating the polymeric acid layer at a rate of at least 30 rpm, and wherein the rinse and etchant solutions are sprayed onto the polymeric acid layer.

33. The method of claim 26 wherein substantially the same chemical composition of etchant solution is used in the first and second etchant exposures, and wherein the time period of the second etchant exposure is shorter than the time period of the first etchant exposure.

34. The method of claim 26 wherein substantially the same chemical composition of rinse solution is used in the first and second rinse exposures, and wherein the time period of the second rinse exposure is longer than the time period of the first rinse exposure.

* * * * *